US005761110A

United States Patent [19]
Irrinki et al.

[11] Patent Number: 5,761,110
[45] Date of Patent: Jun. 2, 1998

[54] MEMORY CELL CAPABLE OF STORING MORE THAN TWO LOGIC STATES BY USING PROGRAMMABLE RESISTANCES

[75] Inventors: V. Swamy Irrinki, Milpitas; Ashok Kapoor; Raymond T. Leung, both of Palo Alto; Alex Owens, Los Gatos; Thomas R. Wik, Livermore, all of Calif.

[73] Assignee: LSI Logic Corporation, Milpitas, Calif.

[21] Appl. No.: 779,992

[22] Filed: Dec. 23, 1996

[51] Int. Cl.⁶ .................................................. G11C 17/14
[52] U.S. Cl. ........................ 365/100; 365/104; 365/148; 365/168; 365/189.07; 257/379
[58] Field of Search ........................ 365/100, 96, 104, 365/148, 163, 168, 189.07; 257/390, 379

[56] References Cited

U.S. PATENT DOCUMENTS

| 4,014,008 | 3/1977 | Groeger et al. | 365/100 |
|---|---|---|---|
| 4,057,788 | 11/1977 | Sage | 365/185.19 |
| 4,633,438 | 12/1986 | Kume et al. | 365/51 |
| 4,661,929 | 4/1987 | Aoki et al. | 365/149 |
| 4,715,014 | 12/1987 | Tuvell et al. | 365/185.28 |
| 4,910,709 | 3/1990 | Dhong et al. | 365/149 |
| 4,935,896 | 6/1990 | Matsumura et al. | 365/187 |
| 5,021,999 | 6/1991 | Kohda et al. | 365/185.03 |
| 5,119,330 | 6/1992 | Tanagawa | 365/185.03 |
| 5,159,570 | 10/1992 | Mitchell et al. | 365/185.03 |
| 5,172,338 | 12/1992 | Mehrotra et al. | 365/185.03 |
| 5,257,225 | 10/1993 | Lee | 365/185.19 |
| 5,282,162 | 1/1994 | Ochii | 365/189.01 |
| 5,283,761 | 2/1994 | Gillingham | 365/189.07 |
| 5,351,210 | 9/1994 | Saito | 365/189.01 |
| 5,357,464 | 10/1994 | Shukuri et al. | 365/185.18 |
| 5,394,362 | 2/1995 | Banks | 365/185.03 |
| 5,459,686 | 10/1995 | Saito | 365/149 |
| 5,521,865 | 5/1996 | Ohuchi et al. | 365/185.22 |
| 5,532,955 | 7/1996 | Gillingham | 365/149 |
| 5,541,869 | 7/1996 | Rose et al. | 365/100 |

OTHER PUBLICATIONS

Abbott, et al., "A 4K MOS Dynamic Random–Access Memory," IEEE Journal of Solid–State Circuits, vol. SC–8, No. 5, Oct. 1973, pp. 292–298.

Primary Examiner—David C. Nelms
Assistant Examiner—Andrew Q. Tran
Attorney, Agent, or Firm—Conley, Rose & Tayon; B. Noel Kivlin

[57] ABSTRACT

A system and process which enables storage of more than two logic states in a memory cell. In one embodiment, a programmable resistor is coupled in series with a transistor between a supply voltage and a data read line. When an access signal is asserted, the transistor provides a conductive path, and a voltage drop is sustained by the programmable resistor. The programmable resistor has a resistance which is set during a programming step to one of a plurality of values by passing a heating current through the programmable resistor for one of a corresponding plurality of predetermined lengths of time. When the access signal is asserted, the voltage drop sustained across the programmable resistor is indicative of the stored logic state. An analog-to-digital (A/D) converter is coupled to the data read line so as to sense the voltage drop and determine the state represented. Since the additional logic states may be used to represent additional information bits, this memory circuit increases the number of bits that may be stored per memory cell, thereby increasing the storage density and reducing the cost per bit.

20 Claims, 4 Drawing Sheets

MEMORY CELL CAPABLE OF STORING MORE THAN TWO LOGIC STATES BY USING PROGRAMMABLE RESISTANCES

BACKGROUND OF THE INVENTION

1. Field of the Invention

This invention relates to the field of solid state devices for information storage, and in particular to a method and structure for storing multilevel logic values in a programmable read-only memory (PROM).

2. Description of the Related Art

Memory devices store and retrieve large quantities of digital data at electronic speeds. Early digital computers used magnetic cores as the devices in fast-access memories. With the introduction of semiconductor memory chips in the late 1960s, magnetic cores began to be replaced by integrated circuits which implement a much higher-density memory function. This not only increased the performance capabilities of the memory, but also drastically decreased its cost. By the end of the 1970s, magnetic core memories had been completely displaced as high-speed memory devices.

Memory capacities in digital systems are commonly expressed in terms of bits (binary digits), since a separate device or circuit is used to store each bit of data. Each storage element is referred to as a cell. Memory capacities are also sometimes stated in terms of bytes (8 or 9 bits) or words (arbitrarily defined, but commonly 16–80 bits). Every bit, byte, or word is stored in a particular location, identified by a unique numeric address. Only a single bit, byte, or word is stored or retrieved during each cycle of memory operation.

The units of memory storage capacity are typically kilobits and megabits (or kilobytes and megabytes). Since memory addressing is based on binary codes, capacities that are integral powers of 2 are typically used. As a result, a memory device with a 1-kbit capacity can actually store 1024 bits, and a 64-kbyte device can store 65,536 bytes.

In digital computers, the number of memory bits is usually 100 to 1000 times greater than the number of logic gates, which implies that the memory cost per bit must be kept very low. In addition, it is desirable for the memory devices to be as small as possible (since this will allow the highest density of cells on a chip), to operate at a high speed, to have a small power consumption, and to operate reliably. To achieve this end, memory cells are designed to be as simple and compact as possible. Typically, the cell itself is not capable of outputting digital data in an electrical form compatible with the requirements of the remainder of the system. To restore the electrical characteristics of the cell's outputted data to adequate values, properly designed peripheral circuits (e.g. sense amplifiers, memory registers, and output drivers) are necessary. These circuits are designed to be shared by many memory cells. The trade-off thus made is that of a less robust output signal from the cell, in exchange for a simple, compact memory cell design.

The most flexible digital memories are those that allow for data storage (hereafter, writing) as well as data retrieval (hereafter, reading). Memories in which both of these functions can be rapidly and easily performed, and whose cells can be accessed in random order (independent of their physical locations), are referred to as random-access memories (RAMs). Read-only memories (ROMs) are those in which only the read operation can be performed rapidly. Entering data into a ROM is referred to as programming the ROM. This operation is much slower than the writing operation used in RAMs.

The storage cells in a typical semiconductor memory are arranged in an array consisting of horizontal rows and vertical columns. Each cell shares electrical connections with all the other cells in its row, and column. The horizontal lines connected to all the cells in the row are called word lines, and the vertical lines (along which data flows into and out of the cells) are referred to as data lines. Each cell therefore has a unique memory location, or address, which can be accessed at random through the selection of the appropriate word and data line. Some memories are designed so that all the cells in a row are accessed simultaneously. This array configuration of semiconductor memories lends itself well to the regular structured designs which are favored in VLSI.

There are a number of important circuits on the periphery of the array. One such peripheral circuit is the address decoder. This circuit allows a large number of word and data lines to be accessed with the fewest number of address lines. Address decoders for this purpose have $2^n$ output lines, with a different one selected for each different n-bit input code. In later generations of memory circuits, address multiplexing was integrated on some memory chips to reduce the number of address pins by half.

Another peripheral circuit is the read/write control circuitry. This circuitry determines whether data is to be written into or read from the memory. Because such circuits also amplify and buffer the data signals retrieved from the cells, one of the important circuits in this subsystem is the sense amplifier. In dynamic memories that need periodic data refreshing, refresh circuitry may also be provided.

Recently, additional peripheral circuits have been added to the basic memory organization structure. These circuits serve mainly to improve the manufacturability and testability of the chips. Those designed to increase manufacturability include redundancy circuits and error-correction circuits. Redundancy circuits allow some defective chips to be salvaged, while self-testing circuits reduce testing time. Error-detection and correction techniques involve the addition of parity bits to allow the system to detect bad data, accomplish parity checking, and in some cases provide correction of the data errors.

Most RAMs have only one input-data lead and one output-data lead (or a single combined input/output lead). Writing into and reading from such RAMs is done one bit at a time. Other RAMs have a number of input- and output-data leads, with the number determined by the word length of the system's data bus. ROMs, on the other hand, are typically organized so that the number of output-data leads is the same as the number of lines on the data bus. ROMs are programmed word by word and are read from in the same manner.

In semiconductor RAMs, information is stored on each cell either through the charging of a capacitor or the setting of the state of a bi-stable flip-flop circuit. With either method, the information on the cell is destroyed if the power is interrupted. Such memories are therefore referred to as volatile memories. When the charge on a capacitor is used to store data in a semiconductor-RAM cell, the charge needs to be periodically refreshed, since leakage currents will remove it in a few milliseconds. Hence, volatile memories based on this storage mechanism are known as dynamic RAMs, or DRAMs.

If the data is stored (written) by setting the state of a flip-flop, it will be retained as long as power is connected to the cell (and flip-flop is not reset by another write signal). RAMs fabricated with such cells are known as static RAMs, or SRAMs. Volatile RAMs can be treated as non-volatile if they are provided with a battery backup. Some DRAM and SRAM chips are even packaged together with a battery to facilitate implementation of this approach.

It is often desirable to use memory devices that will retain information even when the power is interrupted. Magnetic media offer such nonvolatile-memory storage. In addition, a variety of semiconductor memories have been developed with this characteristic. At present, virtually all such nonvolatile memories are ROMs. While data can be entered into these memories, the programming procedure varies from one type of ROM to the other.

The first group of nonvolatile memories consists of those ROMs in which data is entered during manufacturing, and cannot be subsequently altered by the user. These devices are known as masked ROMs (or simply ROMs). The next category consists of memories whose data can be entered by the user (user-programmable ROMs). In the first example of this type, known as a programmable ROM, or PROM, data can be entered into the device only once. In the remaining ROM types, data can be erased as well as entered. In one class of erasable ROMs, the cells must be exposed to a strong ultraviolet light in order for the data to be erased. These ROMs are called erasable-programmable ROMs, or EPROMs. In the final type, data can be electrically erased as well as entered into the device; these are referred to as EEPROMs. The time needed to enter data into both EPROMs and EEPROMs is much longer than the time required for the write operation in a RAM. As a result, none of the ROM types can at present be classified as fully functional RAM devices.

Many variations on the basic memory organization architecture have been developed, including video RAMs and multiport RAMs. Architectures which combine memory and logic circuits on the same chip are becoming increasingly popular. But the primary trends in semiconductor memory development are to increase the storage density and to reduce the cost per bit. It would therefore be desirable to have a method and structure for further increasing the bit storage density and reducing the cost per bit.

SUMMARY OF THE INVENTION

The problems outlined above are in large part solved by a system and process which enables storage of more than two logic states in a memory cell using programmable resistors in accordance with the present invention. In one embodiment, a programmable resistor is coupled in series with a transistor between a supply voltage and a data read line. When an access signal is asserted, the transistor provides a conductive path, and a voltage drop is sustained by the programmable resistor. The programmable resistor has a resistance which is set during a programming step to one of a plurality of values by passing a heating current through the programmable resistor for one of a corresponding plurality of predetermined lengths of time. When the access signal is asserted, the voltage drop sustained across the programmable resistor is indicative of the stored logic state. Each of multiple voltage drop values is representative of a logic state. An analog-to-digital (A/D) converter is coupled to the data read line so as to sense the voltage drop and determine the state represented. Since the additional logic states may be used to represent additional information bits, this memory circuit increases the number of bits that may be stored per memory cell, thereby increasing the storage density and reducing the cost per bit.

Broadly speaking, the present invention contemplates a programmable resistor comprising a mixture of titanium and oxygen coupled to conduct a heating current and a sense current. When the mixture is heated to a temperature of 450° C. by the heating current, it begins to transform to $TiO_2$, thereby increasing the programmable resistor's resistance. When the sense current is present, the programmable resistor sustains a voltage drop indicative of one of at least three logic states.

BRIEF DESCRIPTION OF THE DRAWINGS

Other objects and advantages of the invention will become apparent upon reading the following detailed description and upon reference to the accompanying drawings in which.

Figure 1:
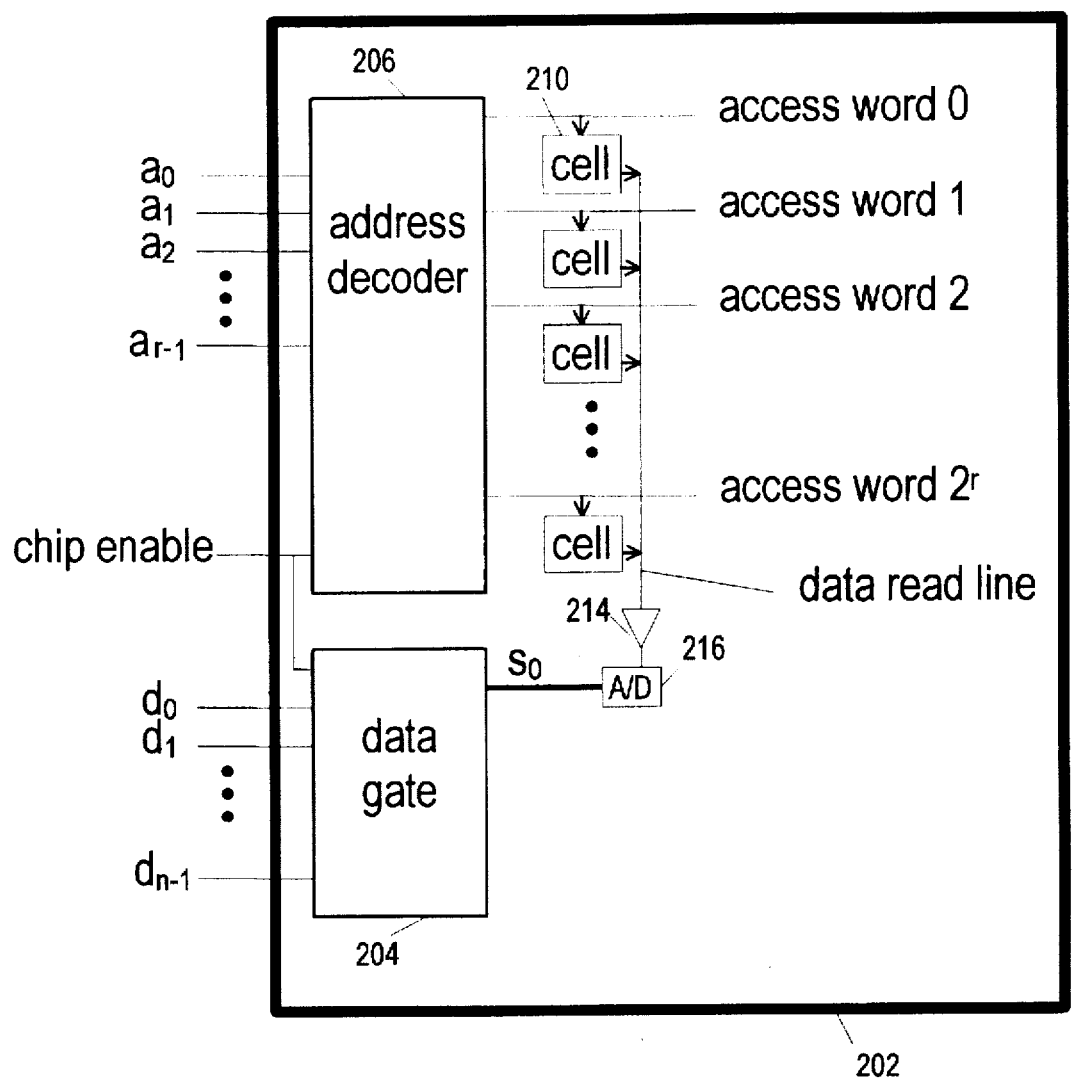
FIG. 1 is a block diagram of a semiconductor memory architecture capable of storing multiple level logic states according to the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIG. 1 shows an exemplary memory architecture employed within a computer system. In this embodiment, memory 200 has a ground plane 202 surrounding the chip circuitry which shields the circuitry from electromagnetic noise. Memory 200 receives a chip enable signal, and r address bit signals at an address decoder 206. During operation when the chip enable signal is asserted, address decoder 206 asserts one of $2^r$ access word lines. Each of the access word lines is coupled to a memory cell. When an access word line is asserted, the corresponding cell may be programmed or read.

Memory 200 also has n binary data lines $(D_0-D_{n-1})$ connected to a data gate 204. Data gate 204 is coupled to receive the enable signal and is further coupled to a data path which carries multi-value logic signal $S_0$. The data path is driven by an analog-to-digital (A/D) converters 216. Each memory cell is coupled by a data read line to sense amplifier 214, which in turn provides input to A/D converters 216.

An exemplary memory read operation is now described. Consider a situation in which the address bits are all zero and the chip enable signal is asserted. Upon occurrence of this situation, address decoder 206 asserts the access word line for word 0 (i.e. "access word 0"). This causes cell 210 to pass a multi-level data signal indicative of information stored to the read data line which is coupled to sense amplifier 214. Sense amplifier 214 detects and amplifies the multi-level data signal and passes the amplified signal to A/D converter 216. A/D converter 216 converts the amplified signal to a multi-value logic signal $S_0$ which is coupled to data gate 204. Data gate 204 converts multi-value logic signal $S_0$ to n binary digital signals, and drives the n bits on data lines $D_0-D_{n-1}$. In this manner, a multi-value logic state stored in each cell may be read.

As will be discussed further below, the programming of the memory cells may be accomplished by increasing the supply voltage and addressing the cells for a pre-determined time interval. The time interval used for each cell determines the logic state stored in that cell.

Figure 2:
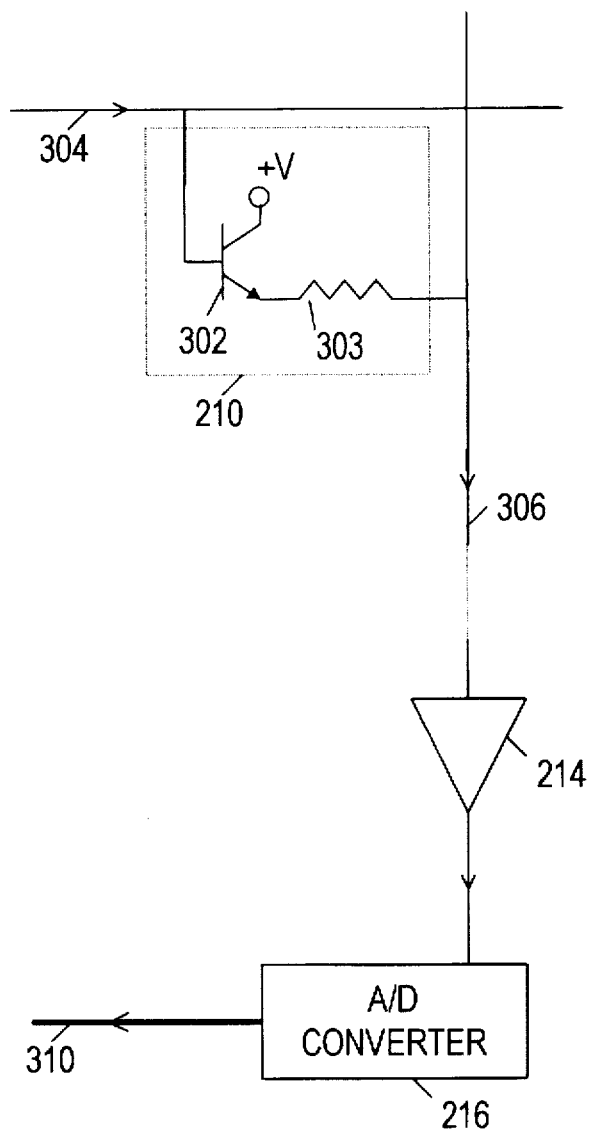
FIG. 2 is a block diagram illustrating the function of a memory cell and the read circuitry.

Turning now to FIG. 2, portions of memory circuit 200 are shown in greater detail. Circuit portions that correspond to those of FIG. 1 are numbered identically for simplicity and clarity. FIG. 2 illustrates a memory cell 210 which is exemplary of each of the cells of FIG. 1. Memory cell 210 includes an access transistor 302 coupled between a supply voltage and a data read line 306. A programmable resistor 303 is coupled in series with access transistor 302. The gate of access transistor 302 is coupled to access word line 304, and when access word line 304 is asserted, access transistor 302 provides a conductive path from the supply voltage to programmable resistor 303. The resistance of programmable resistor 303 induces a voltage drop which is measured and amplified by sense amplifier 214. Sense amplifier 214 provides a signal indicative of the voltage drop to A/D converter 216. In order to sense the voltage drop, sense amplifier 214 draws current from data read line 306 by means of a finite resistance path to ground. A/D converter 216 converts the amplified signal into multi-value logic signal $S_0$.

Figure 3:
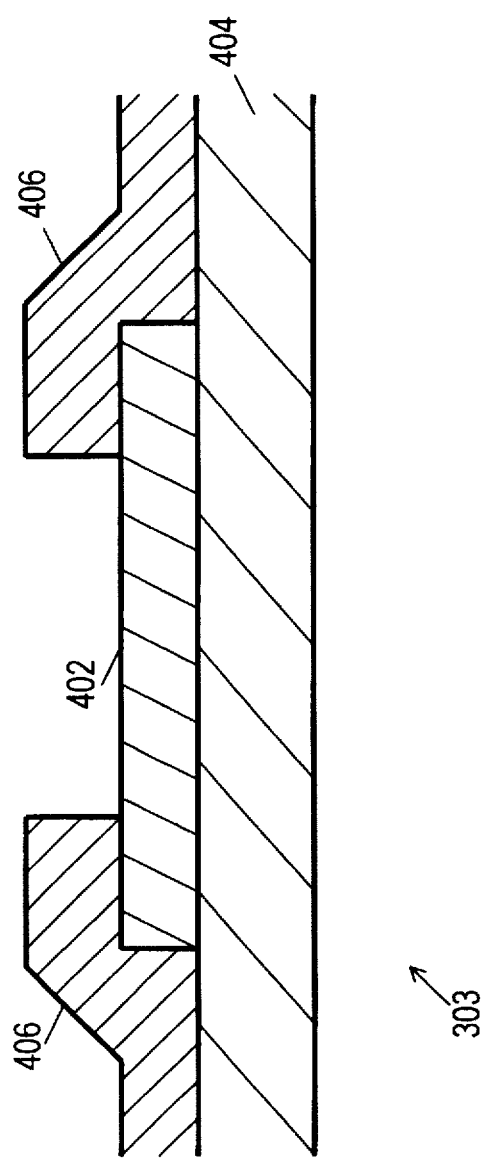
FIG. 3 is a view illustrating the structure of a programmable resistor.

Turning now to FIG. 3, a cross sectional view of programmable resistor 303 is shown. A mixture 402 of titanium and oxygen is located on an insulating dielectric 404. Two metal contacts 406 provide electrical path to mixture 402. This structure may be constructed in the following manner: (1) a dielectric is grown or deposited on a substrate, (2) a titanium film is deposited and patterned, (3) the titanium is doped with oxygen by exposure to oxygen plasma to form mixture 402, (4) an alloy of aluminum and copper is deposited and patterned to form the metal contacts. Subsequent to fabrication, the chip is packaged.

Titanium (Ti) is electrically conductive, and titanium dioxide ($TiO_2$) is an electric insulator. Since mixture 402 is a mixed composition of titanium and titanium dioxide, its resistance can be varied over a wide range. After the chip fabrication and packaging, the composition of mixture 402 can be altered by passing a high current through programmable resistor 303. By heating mixture 402 to a temperature near 450° C., the current causes some of the titanium to form titanium dioxide. As time interval over which the current is applied lengthens, the percentage of titanium in mixture 402 decreases, and the percentage of titanium dioxide increases. The resistance of programmable resistor 303 thus increases accordingly. Eventually, all of the titanium may be converted to titanium dioxide, thereby causing mixture 402 to become a near insulator. The resistance of programmable resistor 303 sustains a voltage drop when a current passes through it.

Figure 4:
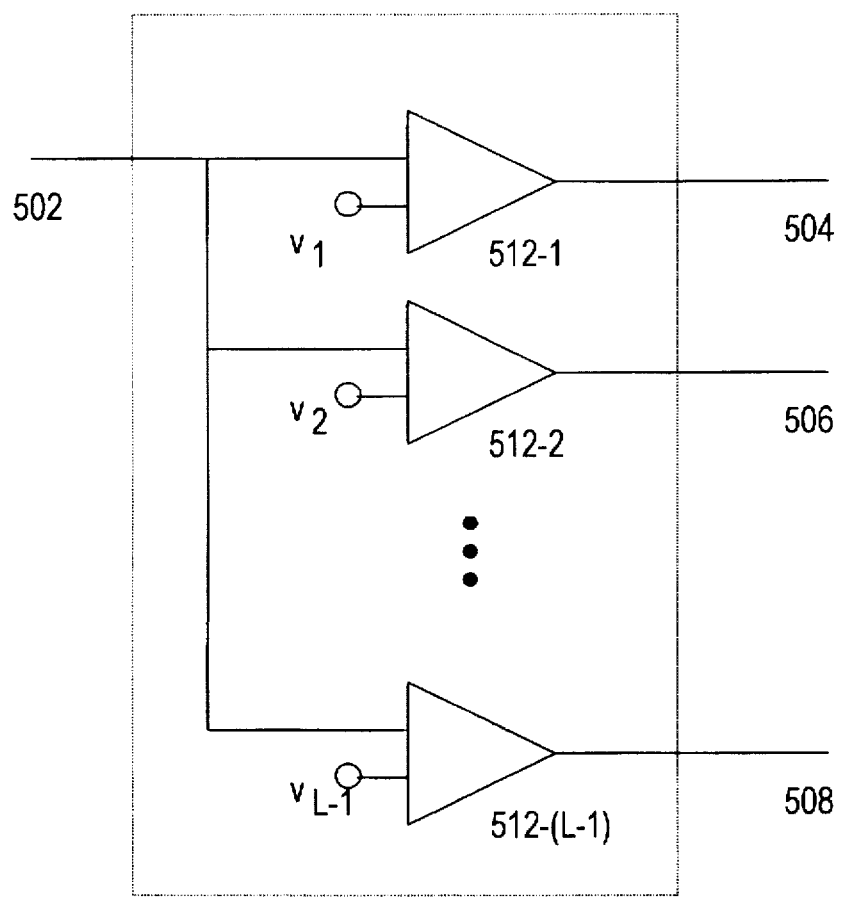
FIG. 4 is a block diagram of an analog to digital converter capable of sensing more than two stored signal states and converting them to digital form.

FIG. 4 shows a block diagram of one embodiment of A/D converter 216. A/D converter 216 receives an input signal 502 and drives a digital output signal on L-1 output lines 504–508 (which form a data path to carry one of the multi-value logic signals $S_0-S_{m-1}$). A/D converter 216 is comprised of L-1 comparators 512, where L is the number of logic states which can be stored in a memory cell 210. Each comparator receives one of L-1 reference voltages which demarcate the voltage regions representative of each logic state. For example, comparator 512-1 compares input signal 502 to reference voltage $V_1$, and asserts output line 504 when input signal 502 exceeds the reference voltage. The L-1 output lines accordingly have L possible states, ranging from having no lines asserted to having L-1 lines asserted.

Turning back to FIG. 1 with continued reference to FIG. 4, in one exemplary configuration of memory 200 wherein each memory cell stores one of four discrete states, memory 200 provides output on two binary data lines $D_0-D_1$ for a given cell. The data for two binary data lines can be represented by one quaternary logic signal. Each programmable resistor 303 is programmed to have one of four possible voltage drops when being read. The programming may be accomplished by connecting to a high voltage power supply and accessing each cell for 10, 4, 1, or 0 time units. Each of the four voltage drops which results from the programmed resistances induces one of four corresponding voltages at the output of the sense amplifier 214. For example, the corresponding output voltages may be 0, V/3, 2V/3, and V, where V is the supply voltage. These may be caused by setting the resistance of the programmable resistor 303 to substantially infinity (by 10 time units of heating), twice the input resistance of sense amplifier 214 (by 4 time units of heating), half the input resistance of sense amplifier 214 (by 1 time unit of heating), or zero (by no heating), respectively. A/D converter 216 includes three output lines and three reference voltages which may be V/6, V/2, and 5V/6. Thus, if the output voltage of a particular cell 210 sensed by a sense amplifier 214 is 2V/3, two of the three output lines are asserted by A/D converter 216. Data gate 204 converts the quaternary logic signal $S_0$ to output data on two binary data lines $D_0-D_1$.

A memory circuit which uses programmable resistors to store three or more logic states has been presented herein. This circuit advantageously provides an increased information storage density by permitting the storage of more than 1 bit of information in each memory cell without increasing the overall scale of the memory cell.

Numerous variations and modifications will become apparent to those skilled in the art once the above disclosure is fully appreciated. It is intended that the following claims be interpreted to embrace all such variations and modifications.

What is claimed is:

1. A programmable resistor of a memory circuit comprising a mixture of titanium and oxygen coupled to conduct a heating current, wherein at least a portion of said mixture is configured to reach a temperature near 450° C. while said heating current is present, and wherein said mixture is configured to at least partially transform to $TiO_2$.

2. The programmable resistor of claim 1, wherein said mixture is coupled to conduct a sense current, and wherein said mixture is configured to sustain a voltage drop.

3. The programmable resistor of claim 2, wherein said mixture is configured to have the voltage drop set to a desired value by conducting said heating current for a predetermined length of time.

4. The programmable resistor of claim 2, wherein said mixture is configured to have the voltage drop set to one of at least three distinct digital values by conducting said heating current for a predetermined length of time.

5. The programmable resistor of claim 1, wherein said mixture is a film deposited on an insulating dielectric layer.

6. The programmable resistor of claim 5, wherein said mixture connected to two metal contacts.

7. The programmable resistor of claim 5, wherein said insulating dielectric layer comprises $SiO_2$.

8. The programmable resistor of claim 6, wherein said metal contacts comprise an alloy of aluminum and copper.

9. A memory circuit comprising:
- an access transistor having a gate, wherein said gate is coupled to receive an access signal, and wherein said access transistor is configured to provide a conductive path between a supply voltage and a data read line when said access signal is asserted;
- a programmable resistor coupled between said supply voltage and said data read line in series with said access transistor, wherein said programmable resistor is configured to sustain a voltage drop when said access signal is asserted; and
- an analog-to-digital converter coupled said data read line to detect a value indicative of said voltage drop, wherein said analog to digital converter is configured to convert said value to one of at least three distinct digital values.

10. The memory circuit of claim 9 wherein the programmable resistor has a resistance which is set to determine the voltage drop, said resistance is set to one of at least three magnitudes.

11. The memory circuit of claim 10, wherein the programmable resistor comprises two chemical reactants and a compound, wherein said reactants are configured to form said compound when heat is applied, and wherein said heat is applied for a predetermined length of time to said compound to set the resistance of said programmable resistor.

12. The memory circuit of claim 11, wherein said reactants are titanium and oxygen, and said compound is $TiO_2$.

13. The memory circuit of claim 11, wherein said heat is applied by passing a heating current through said programmable resistor.

14. The memory circuit of claim 9, wherein said analog-to-digital converter comprises a plurality of comparators, each coupled to compare an input voltage to one of a plurality of reference voltages.

15. The memory circuit of claim 9, further comprising an address decoder configured to assert said access signal in response to receiving an address signal and an enable signal.

16. The memory circuit of claim 9, further comprising a data gate configured to convert said distinct digital values into n binary data bits during a read operation.

17. The memory circuit of claim 9, further comprising a sense amplifier coupled to detect said voltage drop, said sense amplifier configured to responsively provide said value to said analog-to-digital converter.

18. A method for storing more than two logic states in a memory cell, comprising the steps of:
- fabricating an array of access transistors each having a gate, wherein said gate is coupled to receive an access signal, and wherein each of said access transistors is configured to provide a conductive path between a supply voltage and a data read line when said access signal is asserted;
- fabricating an array of programmable resistors, wherein each of said programmable resistors is coupled between said supply voltage and said data read line in series with a corresponding one of said access transistors, wherein each of said programmable resistor is configured to sustain a voltage drop when said access signal is asserted; and
- applying a heating current to a first set of programmable resistors for a first predetermined length of time to cause said first set of programmable resistors to have a first resistance;
- applying a heating current to a second set of programmable resistors for a second predetermined length of time to cause said second set of programmable resistors to have a second resistance; and
- applying a heating current to a third set of programmable resistors for a third predetermined length of time to cause said third set of programmable resistors to have a third resistance.

19. The method of claim 18, further comprising the step of fabricating an analog-to-digital converter coupled to detect a value indicative of said voltage drop, wherein said analog to digital converter is configured to convert said value to one of at least three distinct digital values.

20. The method of claim 18, further comprising the step of fabricating an address decoder configured to assert said one of said access signals in response to receiving an address signal and an enable signal.

* * * * *